United States Patent
Maekawa et al.

[11] Patent Number: 6,114,052
[45] Date of Patent: Sep. 5, 2000

[54] INGOT PLATE MADE OF THERMOELECTRIC MATERIAL, RECTANGULAR BAR CUT FROM THE INGOT PLATE, AND PROCESS OF FABRICATING THE INGOT PLATE

[75] Inventors: Nobuteru Maekawa, Katano, Japan; Belov Iouri Maksimovich, Moscow, Russian Federation

[73] Assignees: Matshsuhita Electric Works, Ltd., Osaka, Japan; Crystal Ltd., Moscow, Russian Federation

[21] Appl. No.: 09/125,048
[22] PCT Filed: Jan. 8, 1998
[86] PCT No.: PCT/JP98/00036
§ 371 Date: Aug. 12, 1998
§ 102(e) Date: Aug. 12, 1998
[87] PCT Pub. No.: WO98/31056
PCT Pub. Date: Jul. 16, 1998

[30] Foreign Application Priority Data

Jan. 9, 1997 [RU] Russian Federation .............. 97100200
Oct. 7, 1997 [RU] Russian Federation .............. 97117887

[51] Int. Cl.$^7$ .................................................. B32B 15/01
[52] U.S. Cl. ............................... 428/636; 83/906; 117/81; 117/22.3; 148/538; 148/33.3; 148/404; 164/66.1; 164/122.1; 164/122; 164/125; 164/131; 164/410; 164/DIG. 6; 249/105; 249/141; 257/42
[58] Field of Search ..................................... 428/620, 645, 428/646, 648, 651, 643, 663, 664, 665, 672, 680, 925, 636; 148/538, 33.3, 404; 438/102, 113, 460; 257/42, 614, 930; 420/576, 577, 580; 164/66.1, 122.1, 122, 125, 131, 410, DIG. 6; 83/906; 249/105, 141; 117/81, 223

[56] References Cited

U.S. PATENT DOCUMENTS 1,793,672  2/1931  Bridgman ................. 117/223
3,944,393  3/1976  Schierding et al. ..................... 117/223
5,747,728  5/1998  Fleurial et al. .......................... 257/930
5,950,067  9/1999  Maegawa et al. ....................... 257/930
5,959,341  9/1999  Tsuno et al. ............................. 257/930

FOREIGN PATENT DOCUMENTS 894307    4/1962   United Kingdom.
913588   12/1962   United Kingdom.
WO 95/11583  4/1995   WIPO.
WO 98/31056  7/1998   WIPO.

OTHER PUBLICATIONS

A. Sher, et al., "Preparation of Oriented Thermoelectric Material," Mat. Res. Bull., vol. 17, No. 7, pp. 899–902, Jul. 1982.

*Primary Examiner*—Deborah Jones
*Assistant Examiner*—Robert R. Koehler
*Attorney, Agent, or Firm*—Arent Fox Kintner Plotkin & Kahn, PLLC

[57] ABSTRACT

An ingot plate (10) of cleaveable thermoelectric material has a layered structure having substantially parallel cleavage planes. Substantially all of the cleavage planes are disposed at a less cleavage angle with respect to the upper and lower faces (11, 12) of the plate. The ingot plate can be successfully cut into bars (20) along cutting planes generally perpendicular to the cleavage planes without causing substantial interlayer fracture. Electrodes (25) are formed on the opposite sides of the bar which are defined by the cutting planes. The bar is in use to be cut into a number of discrete chips (30) with one of the electrodes fixed on a substrate. Since the cutting is made along planes again generally perpendicular to the cleavage planes of the bar, the bar can be successfully cut into the corresponding chips without causing any substantial fracture. The ingot plate is fabricated by the use of a mold having a mold cavity (63) and an elongated slit (75) which extends from the cavity to a distal end within the mold. After a molten material is filled within the cavity and also in the slit, crystallization of the material starts from the distal end of the slit along the slit and proceeds in the cavity in substantially the same direction, thereby giving the layered structure to the ingot plate.

13 Claims, 8 Drawing Sheets crystallization direction

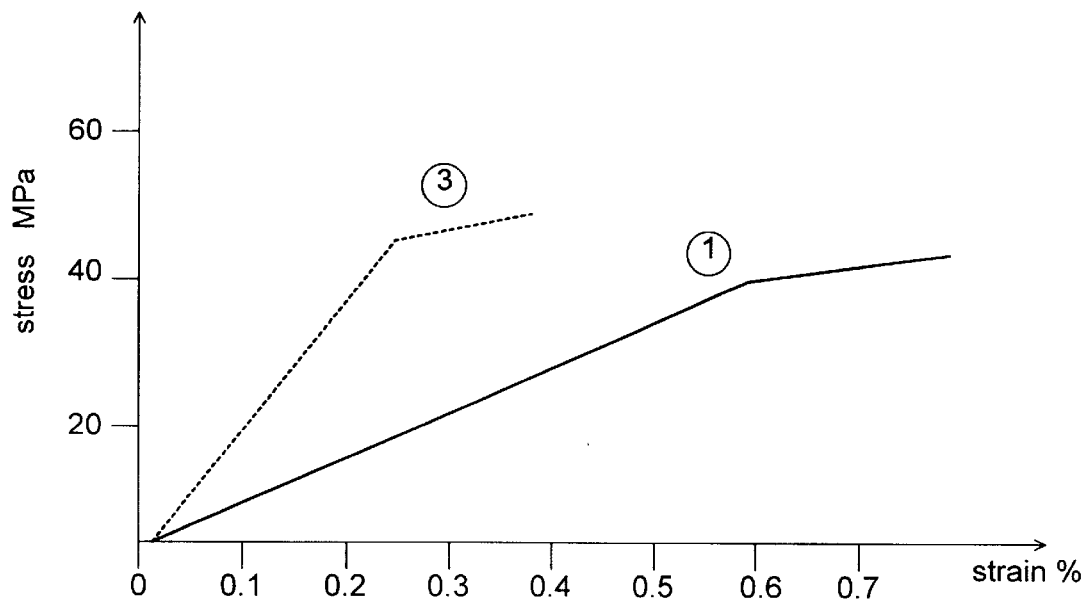

INGOT PLATE MADE OF THERMOELECTRIC MATERIAL, RECTANGULAR BAR CUT FROM THE INGOT PLATE, AND PROCESS OF FABRICATING THE INGOT PLATE

TECHNICAL FIELD

The present invention is directed to an ingot plate made of crystallized cleaveable thermoelectric material, a rectangular bar cut from the ingot plate, and a process of fabricating the ingot plate, and more particularly to a molded thermoelectric material which is adapted in use to be cut into thermoelectric chips that are assembled into a thermoelectric heater/cooler or thermoelectric generator.

BACKGROUND ART

In the thermoelectric heater/cooler, a plurality of thermoelectric chips of P-type and N-type semiconductors are connected alternately in series with to form a circuit through which a current is fed to heat the one face of the P-type chip and the N-type chip and at the same time to cool the other face of the P-type chip and N-type chip. Conventionally, the chips are cut out from a cylindrical ingot of thermoelectric material. Practically, the chips are made firstly by slicing the cylindrical ingot into a disk and subsequently by cutting the disk along two mutually perpendicular vertical planes. However, since the cylindrical ingot inherently includes some cleavage planes parallel to the direction of crystallization, i.e., perpendicular to the top and bottom of the cylinder, the slicing of the cylinder leads frequently to undesired fracture of the material so that the disk is difficult to be sliced intact from the cylinder. For this reason, the chips have to be obtained from an incomplete disk or fragments thereof. Thus, much waste of material is inevitable to lower the yield factor of the chip production.

In the meanwhile, for enhancing assembly efficiency, it has been proposed to use a bar-shaped thermoelectric element which can be cut into the discrete chips after being mounted on a substrate with an electric circuit for feeding the current to the chips. This mounting technique with the use of the bar-shaped elements is advantageous in that the chips can be mounted to the substrate easier rather than mounting the discrete chips separately; that the chips of the uniform thickness and characteristics can be arranged in good order on the substrate; and that there is less possibility to arrange the chips of P-type and N-type in a wrong order.

However, the bar-shaped elements of uniform length, characteristics and sufficient strength against the cutting are practically impossible to be cut out from the above conventional cylindrical ingot for the above reasons and particularly for that the ingot or the disk cut out therefrom inherently suffers from randomly oriented developments of the cleavage planes. Therefore, it is mostly desired to make such an ingot plate of a layered structure having uniformly oriented cleavage planes that can be successfully cut into the bar-shaped element which is then cut into discrete chips of uniform characteristics.

Japanese Laid-Open Publication (KOKAI) No. 1-202343 discloses a continuous molding of thermoelectric element which might be effective to obtain the ingot plate. However, this method necessitates a very strict control over molten liquid of the material prior to solidification thereof in order to obtain the ingot plate of uniform characteristics. Therefore, it is practically difficult to make ingot plate by this method. Even if the method could provide the ingot plate, the desirable layered structure of uniformly oriented cleavage planes can not be expected.

DISCLOSURE OF THE INVENTION

The present invention has been accomplished in view of the above insufficiency and provides a novel ingot plate made of a crystalllized cleaveable thermoelectric material, a rectangular bar cut from the ingot plate which can be further cut into thermoelectric chips after being mounted on a substrate, and a process of fabricating the ingot plate. The ingot plate (10) is made to have opposed upper and lower faces (11,12), opposed longitudinal end faces (13), and opposed side faces (14). The ingot plate is of a layered structure having substantially parallel cleavage planes (X1 to Xn; Y1 to Yn), and has a direction of crystallization, i.e., grain growth which is generally perpendicular to said longitudinal end faces (13). Substantially all of the cleavage planes appearing in said opposed end faces are disposed at a first cleavage angle of not more than 26.4° with respect to the upper and lower faces, and substantially all of the cleavage planes appearing in the side face are disposed at a second cleavage angle of not more than 10° with respect to the upper and lower faces. Because of this layered structure having the parallel cleavage planes generally parallel or at a slight angle to the upper and lower faces, the ingot plate can be successfully cut into rectangular bars along cutting planes substantially perpendicular to the cleavage planes without causing substantial interlayer fracture of the material.

Preferably, the first cleavage angle which is defined by edge of the cleavage plane appearing in the longitudinal end face is not more than 10° and the second cleavage angle defined by edge of the cleavage plane appearing in the opposed side face is not more than 5°. This layered structure gives rise to a superior combination of mechanical strength, electro-physical and thermo-physical properties.

The cleaveable thermoelectric material forming the igot plate is collectively defined to have Av-Bvi components, in which Av and Bvi denote material resepectively selected from the groups V and VI of the periodic table.

The layered structure may include a first layered matrix (M1) with first parallel cleavage planes (X1 to Xn) and a second layered matrix (M2) with second parallel cleavage planes (Y1 to Yn) which are inclined with respect to the first cleavage planes. Because of the formation of the two mutually inclined cleavages planes each extending at the limited angles of not more than 10° with respect to the upper and lower faces, the ingot plate exhibits an increased mechanical strength and toughness, yet retaining the above described advantages.

The ingot plate (10) of this configuration is cut along parallel cutting planes substantially perpendicular to the cleavage planes into a plurality of bars (20) each having opposed top and bottom (21, 22), opposed sides (23), and opposed longitudinal ends (24). The resulting bar has the opposed sides (23) which are defined respectively by the parallel cutting planes so that the bar has a uniform dimension between the opposed sides along the entire length of the bar. The edges of the cleavage planes appear in the oppose sides and lie substantially parallel with the opposed top and bottom. Formed on each of the opposed sides (23) is at least one electro-conductive layer (25, 26, 27). The bar is adapted in use to be cut into a plurality of discrete chips (30) with one of the opposed sides fixed on a substrate (50). In this sense, the bar is given a height (H) measured between the opposed sides (23), i.e., between the electro-conductive layers (25). Since the cutting is made with the opposed sides fixed on the substrate, the resulting chips have uniform height. Also, since the cutting is made along planes again generally perpendicular to the cleavage planes of the bar, the bar can be successfully cut into the corresponding chips without causing any substantial fracture.

Each of the opposed sides (23) is in the form of a rectangular having a length (L) between the opposed ends and a width (W) between the top and bottom. The electro-conductive layer (25) defines an electrode for flowing an electric current through the chip (30) and is formed centrally on each of the opposed sides (23) to extend over an electrode length (E) in such a manner as to leave blank areas (29) on the longitudinal end portions on each of the opposed sides. The blank areas are in use grasped by suitable jigs for mounting the bar on the substrate. In order to give necessary dimensions to the blank areas as well as to give at least two chip from the single bar, the length (L) of the bar is at least five times the width of the bar and the electrode length (E) is at least two times the width (W) when, for example, the bar has a width of 1.4 mm.

The electro-conducitve layer (25) is made of a material selected from a first group consisting of Pb—Sn, Bi—Sn, Sb—Sn, Sn, and Au to define an electrode for soldering connection of the bar to an external electric circuit. Second and third electro-conductive layers (26, 27) are formed in this order under the above layer in order to block the diffusion of the constituents of the semiconductor material. For this purpose, the third innermost layer (27) is made of a material selected from a third group consisting of Mo and W which inhibits the consitituents from forming an alloy, while the second intermediate layer (26) is made of a material selected from a second group consisting of Ni and Al which, in addition to bonding the first and third electro-conductive layers, prevent the diffusion of the constituents outwardly of the bar. Further, the second electro-conductive layer has a thickness sufficiently greater than the third electro-conductive layer for enhancing mechanical strength.

The above ingot plate (10) is fabricated by the use of a molding die (60) with a flat cavity (63), a filling opening (64) at one longitudinal end of the cavity, and at least one elongated slit (75) extending from the other longitudinal end of the cavity in a direction away from said cavity (63) and terminating at a distal end (76) within the molding die. The ingot plate is made firstly by introducing a molten semiconductor material into the flat cavity through the filling opening and penetrating the molten material through the slit (75) into the distal end. Then, the molten material is allowed to start crystallization at the distal end of the slit and to proceed the crystallization along the length of the slit towards the cavity, whereby the material in the cavity is crystallized continuously from the individual runners along the longitudinal direction of the cavity. Consequently, the resulting ingot plate is given a uniform direction of grain growth and the layered structure in which a plurality of cleavage planes lie generally parallel to the top and bottom faces of the ingot plate. Thus, the edges of the cleavage planes appears in the opposed side and end faces of the ingot plate. With this process, the ingot plate can have such layered structure as to be successfully cut into the bars as desired without causing the interlayer fracture. That is, thus fabricated ingot plate is cut along parallel cutting planes generally perpendicular to the cleavage planes and the crystallization direction to give the bars each having the opposed top and bottom, the opposed ends, and the opposed sides which are defined respectively by the cutting planes.

An electro-conductive layer (25) is formed on each of the opposed sides (23) of the bar (20) to give an electrode for the material. The bar is then cut into a plurality of chips (30) each having a pair of the electrodes (25) on opposite ends of the direction of the grain growth.

These and still other objects and advantageous features of the present invention will become more apparent from the following detailed description of the embodiments when taken in conjunction with the attached drawings.

BRIEF DESCRIPTION OF THE DRAWINGS

FIG. 20 is a graph illustrating a stress-strain relationship for the material in accordance with the present invention in comparison with the conventional thermoelectric material;

FIG. 21 is a graph illustrating a relation between thermoelectric figure of index Z and a maximum strain before fracture for the ingot plate of the present invention and the conventional thermoelectric plate.

BEST MODES FOR CARRYING OUT THE INVENTION

Figure 1:
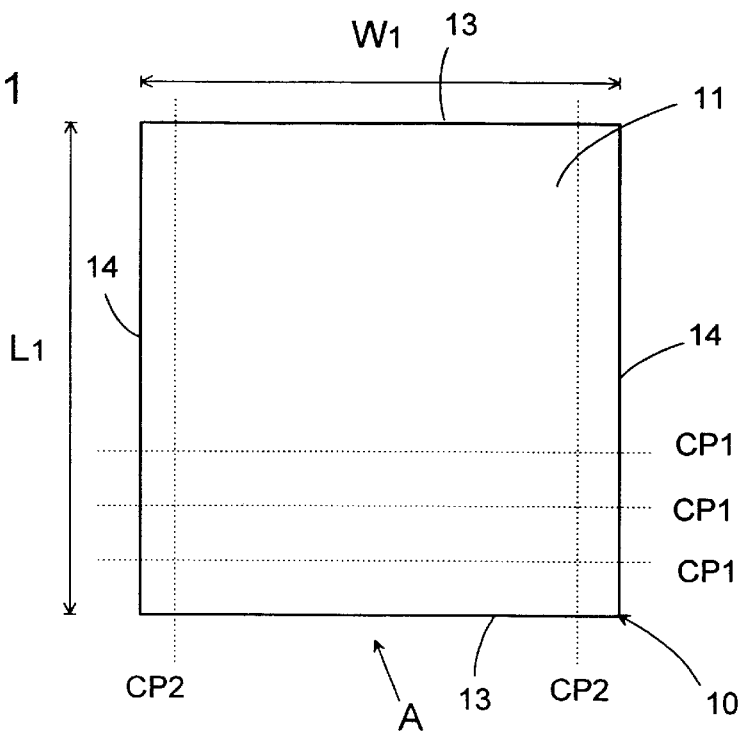
FIG. 1 is a plan view of an ingot plate in accordance with the present invention.
Figure 2:
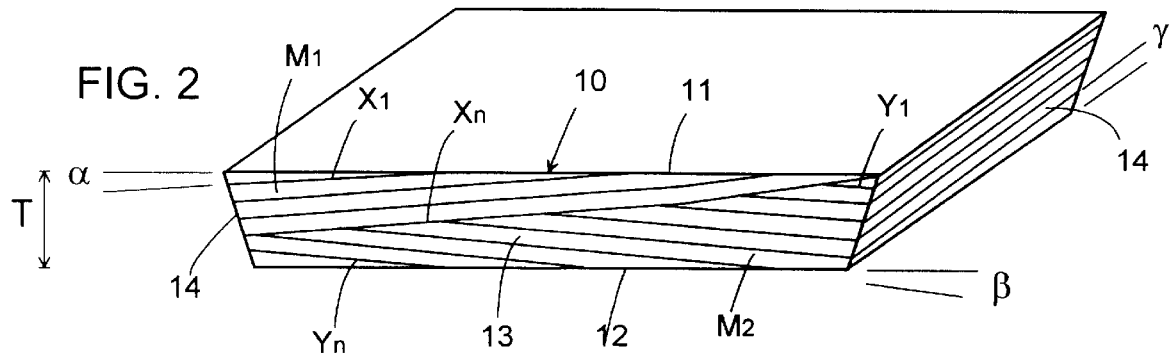
FIG. 2 is a perspective view as viewed from a direction indicated by an arrow A of FIG. 1.

Referring now to FIGS. 1 and 2, there is shown an ingot plate 10 made of a cleaveable thermoelectric material in accordance with the present invention. The ingot plate 10 is made of a P-type or N-type semiconductor, for example, $A_VB_{VI}$ type crystalline material such as Bi—Te—Sb—Se to have opposed upper and lower faces 11 and 12, opposed longitudinal end faces 13, and opposed side faces 14. In this embodiment, the ingot plate 10 is dimensioned to have a length L1 of 45 mm, a width W1 of 41 mm, and a thickness T of 1.4 mm. As shown in FIG. 2, the ingot plate 10 has a layered structure with parallel cleavage planes X1 to Xn and Y1 to Yn between single-crystal or block crystals. The parallel cleavage planes lie generally parallel to the top and bottom faces 11 and 12 of the ingot 10 plate to give a slight first cleavage angle (α, ε) of 26.4° or less at which substantially all of the cleavage planes appearing in the longitudinal end faces 13 are disposed with respect to the top and bottom faces 11 and 12, and a slight second cleavage angle γ of 10° or less at which substantially all of the cleavage planes appearing in the side faces 14 are disposed with respect to the top and bottom faces 11 and 12.

As shown in FIG. 2, the layered structure may include a first layered matrix M1 with first parallel cleavage planes X1 to Xn and a second layered matrix M2 with second parallel cleavage planes Y1 to Yn which cross with the first cleavage planes at a small angle. By the combination of the first and second layered matrices crossing with one another, the ingot plate exhibits an increased mechanical strength and toughness against an external force applied when cutting the plates in pieces or thermal stress applied during the use of the material.

Figure 4:
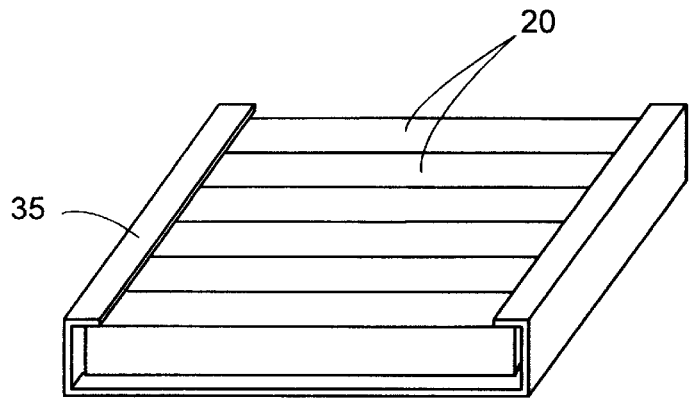
FIG. 4 is a perspective view of a frame holding the thermoelectric bars for deposition of an electrode on the bars.
Figure 5:
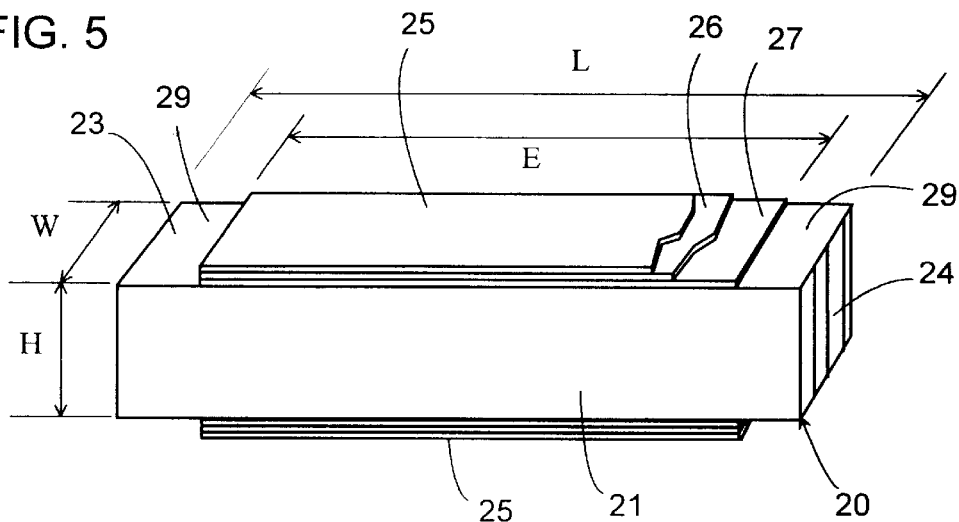
FIG. 5 is a perspective view of the thermoelectric bar formed with electrodes.
Figure 8:
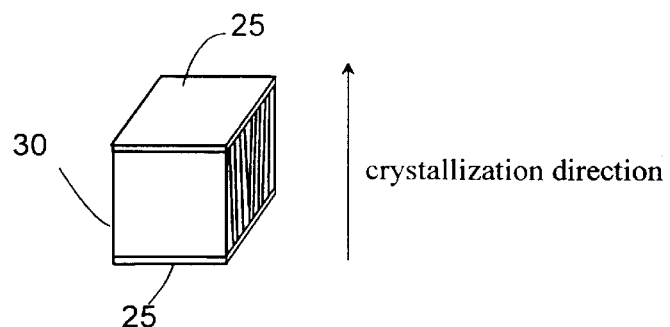
FIG. 8 is a perspective view of a chip cut out from the above bar.

The ingot plate 10, which is fabricated by the use of a mold 60 as will be explained hereinafter, is cut along parallel cutting planes CP1 and CP2 as shown by dotted lines in FIG. 1 into plural bars 20 each having top and bottom 21 and 22 defined by the top and bottom faces of the plate 10, opposed sides 23 defined by the cutting planes CP1 and opposed longitudinal ends 24 defined by the cutting planes CP2. Each of the bars 20 cut out from the plate 10 is then deposited on the opposed side 23 with three electro-conductive layers 25, 26, and 27, as shown in FIG. 5, which form thereon individual electrodes 25. The deposition is made by holding the plural bars 20 with a frame 35, as shown in FIG. 4, so that the three-layered electrode is formed continuously along the substantial length of the bar 20 only except for an end portion to leave blank areas 29 on the longitudinal portions of the bar 20, as shown in FIG. 5. The three-layered electrode is composed of a first outer layer 25 made of a material selected from a first group consisting of Pb—Sn, Bi—Sn, Sb—Sn, Sn, and Au for a soldering connection of the bar to an external electric circuit, a second intermediate layer 26 of a material selected from a second group consisting of Ni and Al, and a third innermost layer 27 of a material selected from a third group consisting of Mo and W. The second and third layers are provided to block the diffusion of the constituents of the semiconductor element to the first layer. The first layer 25 made of the above material serves also to inhibit oxidization of the opposed sides 23 of the bar defined by the cutting planes. The second electro-conductive layer (26) prevents the diffusion of the constituents outwardly of the bar, in addition to bonding the first and third electro-conductive layers. Further, the second electro-conductive layer has a thickness sufficiently greater than the third electro-conductive layer for enhancing mechanical strength.

Figure 9:
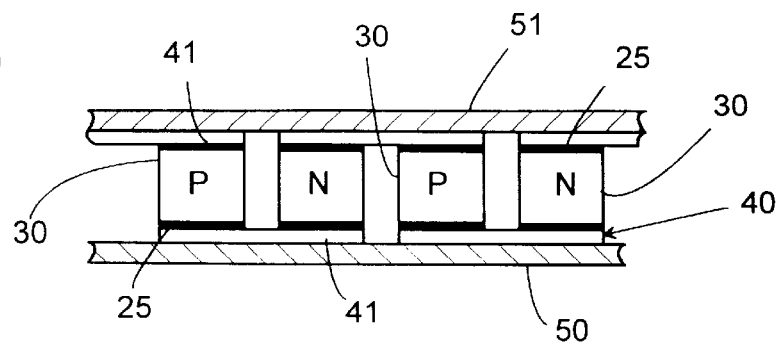
FIG. 9 is a schematic view illustrating a connection between the adjacent chips of P-type element and N-type.
Figure 6:
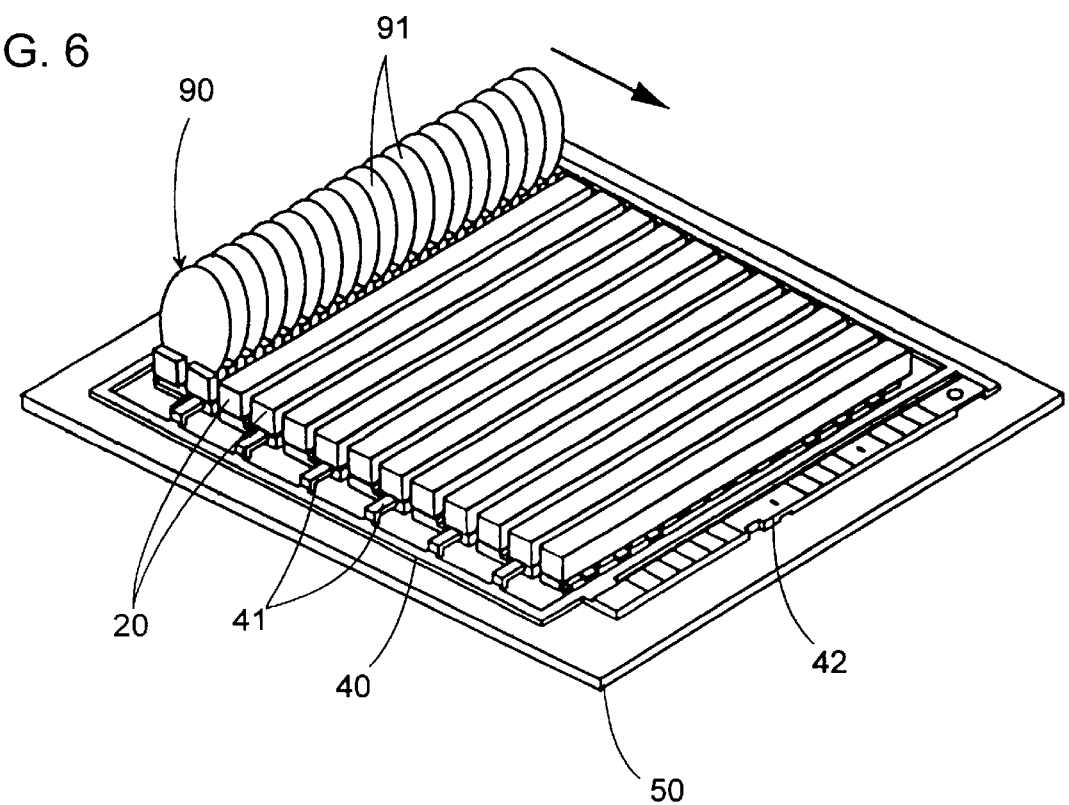
FIG. 6 is a perspective view illustrating a manner of cutting the thermoelectric bar into chips after mounting the bars on a substrate of the thermoelectric module.
Figure 7:
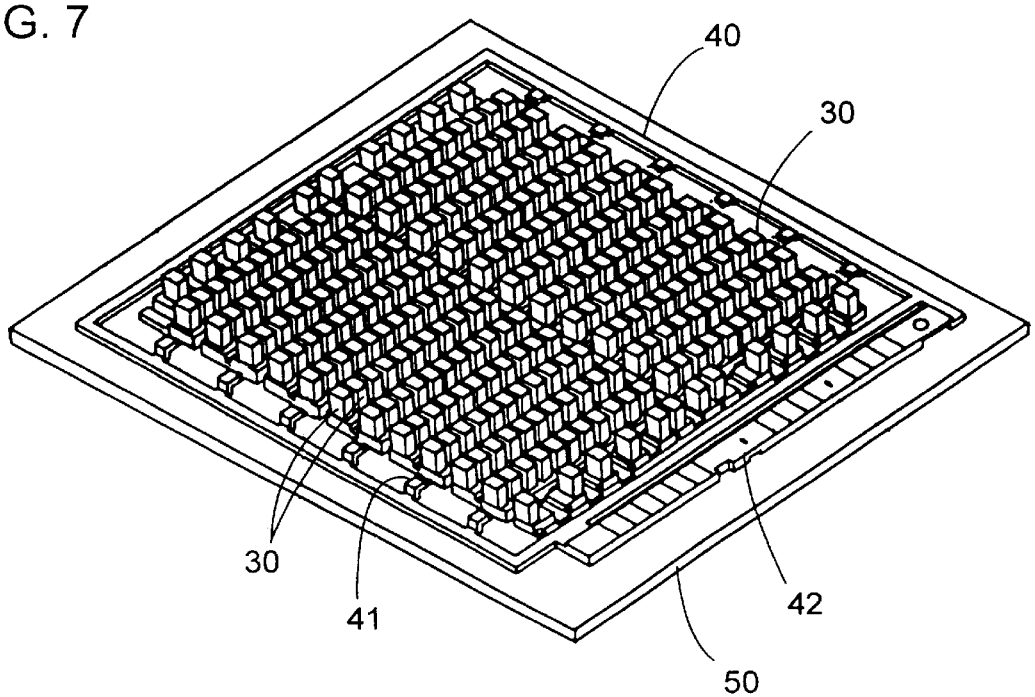
FIG. 7 is a perspective view of the thermoelectric module mounting a number of chips.

As shown in FIGS. 6, 7, and 9, the P-type and N-type bars 20 with thus deposited electrodes 25 are mounted by soldering the electrode to terminal lands 41 of a circuit conductor pattern 40 carried on a ceramic substrate 50 for constituting a combination heater and cooler module. The P-type and N-type bars 20 are arranged in rows with the P-type bars alternating the N-type bars, as shown in FIG. 6. Subsequently, a cutter unit 90 with evenly spaced cutters 91 is advanced in the direction perpendicular to the length of the bar in order to cut each of the bar 20 into a plurality of discrete chips 30.

Thereafter, another substrate 51 with a like circuit conductor pattern is placed over the chips 30 by soldering to achieve the series electrical connection of the P-type and N-type chips 30 arranged in rows, as shown in FIG. 9. The conductor pattern 40 has power terminals 42 which are connected to feed electric current through the series connected P-type and N-type chips 30 to thereby heat on one surfaces adjacent to one substrate 50 and cool the other surface adjacent to the other substrate 51. The blank areas 29 at the longitudinal ends of the bar 20 where no electrode is formed are removed away from the module. However, the blank areas 29 are necessary as they are grasped by jigs when placing the bars on the substrate 50.

It should be noted here that since the cleavage planes lie substantially in parallel with the upper and lower faces of the ingot plate 10, the cutting of the ingot plate 10 along mutually perpendicular cutting planes CP1 and CP2 is not likely to bring about fracture along the cleavage planes. Therefore, it is readily possibly to obtain the defect-free bars 20 of uniform length with enhanced yield factor. Also because of that the cutting of the bar 20 into the discrete chips 30 is also made along cutting planes substantially perpendicular to the cleavage planes, the resulting chips can be kept intact and form a reliable thermoelectric circuit.

Since the bar 20 is mounted on the module with one of the electrodes 25 soldered to the circuit conductor pattern 40 of the module, the bar 20 can be denoted to have a height (H) measured between the opposed sides 23 and a width (W) measured between the opposed top and bottom 21 and 22. The bar 20 utilized in the above module is preferred to have a length (L) of about 30 to 100 mm and a width (W) of 0.5 to 2.0 mm, and a height (H) of about 0.5 to 2.0 mm. However, in view of the above intended use of the bar 20 to be cut into at least two chips 30 of square planar configuration and also of the necessity of the blank areas 29 for placing the bars on the module, it is sufficient that an electrode length (E) on the bar is at least two times the width (W) and the entire length (L) of the bar is at least five times the width (W). As a matter of course, these dimensions are preferred and not to be understood to restrict the scope of the invention.

Figure 10:
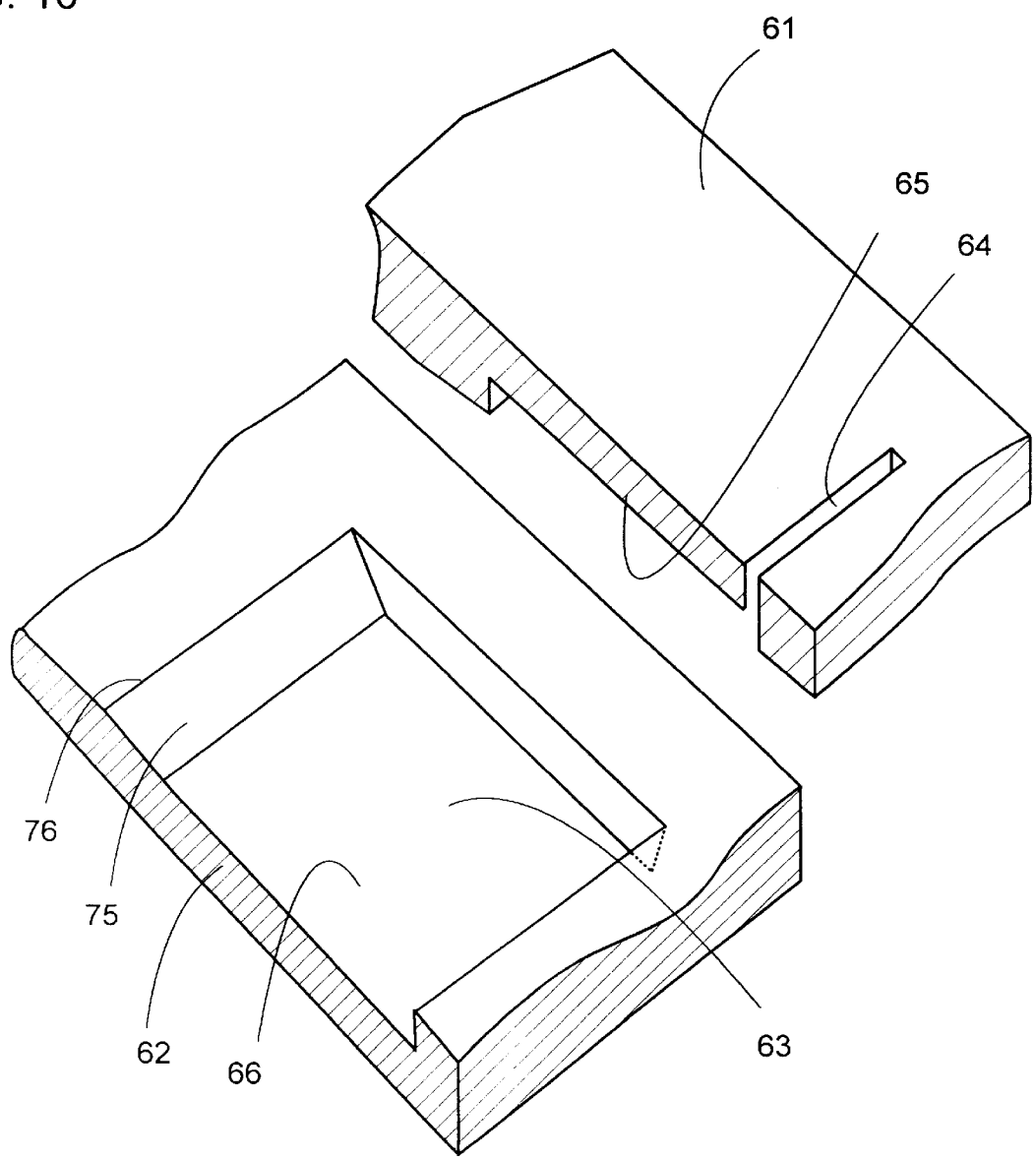
FIG. 10 is a perspective view of a portion of a mold utilized for fabricating the above ingot plate.
Figure 11:
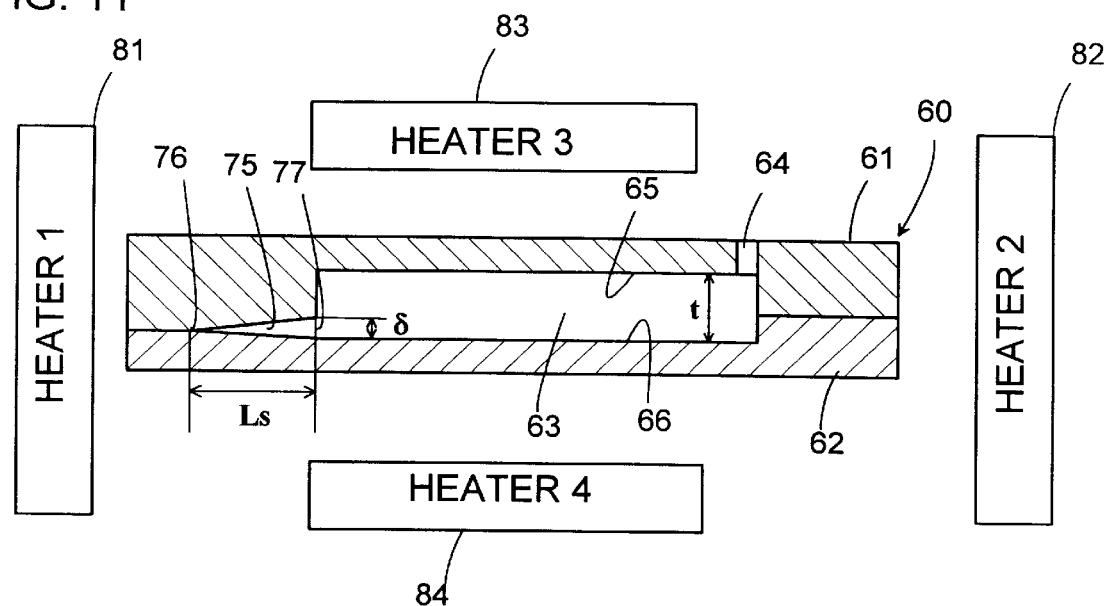
FIG. 11 is a schematic view illustrating an arrangement of the above mold and associated heaters for fabrication of the ingot plate.
Figure 12:
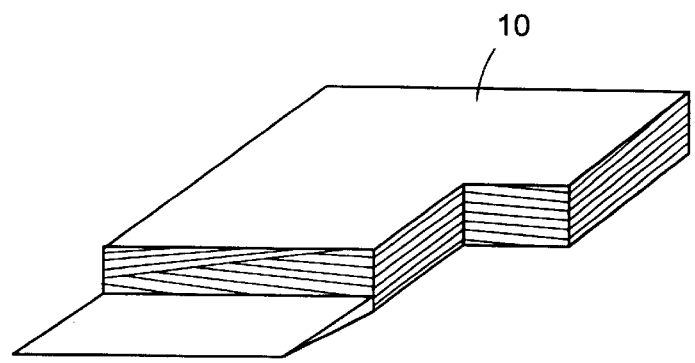
FIG. 12 is a perspective view of the ingot plate formed within the mold.
Figure 13:
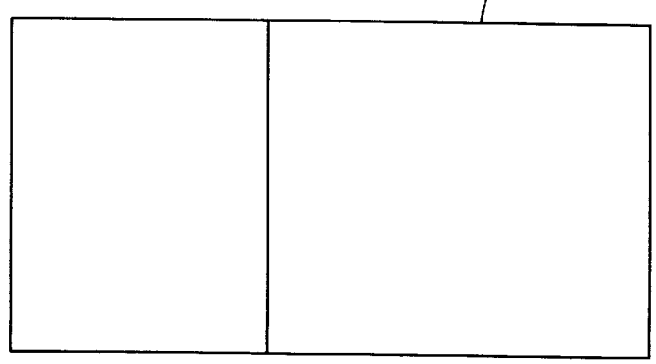
FIG. 13 is a top view of the ingot plate of FIG. 12.
Figure 14:
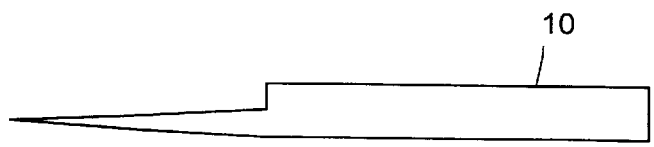
FIG. 14 is a side view of the ingot plate of FIG. 12.

As shown in FIGS. 10 and 11, the mold 60 comprises an upper die 61 and a lower die 62 which are both made of graphite to define a flat mold cavity 63 therebetween. A filling opening 64 is provided in the upper die 61 at one longitudinal end of the cavity 63 to pour a molten semiconductor material therethrough into the cavity 63. The mold cavity 63 is confined between opposite flat top and flat bottom inner walls 65 and 66. Also formed between the upper and lower dies is an elongated slit 75 which extends from the other longitudinal end of the cavity 63 in a direction away from the cavity 63 and terminate in a distal end 76. The slit 75 has an aperture 77 for communication with said cavity 63. The slit 75 has a thickness which is narrower towards the distal end 76 than at the aperture 77, while the slit as well as the cavity are formed to have a uniform thickness along a width dimension, i.e., perpendicular to the paper of FIG. 11. The aperture 77 has a thickness δ of 0.2 mm significantly smaller than a cavity thickness t of 1.4 mm. The slit 75 has a length Ls which is selected to satisfy the following expression in addition to the thickness δ of aperture significantly less than the cavity thickness t (δ⊥ t), in order to give the intended layered structure to the ingot plate.

For example, the slit length Ls is selected to be 7 mm. A relation between the above expression and an exact mechanism for giving the layered structure as intended is not understood but the above relation is obtained through experiments.

The molten material is firstly filled in the cavity 63 and then forced to penetrate through the slit 75 into the distal end 76, while $$\tan^{-1}\left(\frac{\delta}{Ls}\right) < 7°$$

expelling an initially filled inert gas through a parting line of the dices. Until the molten material fills the slit 75 and the cavity 63, the dices are kept at a temperature higher than the melting temperature of the material, for example, 550 to 620° by first and second heaters 81 and 82 located respectively adjacent to the distal end 76 and to the opposite longitudinal end of the cavity 63, as well as by third and fourth heaters 83 and 84 respectively disposed above and below the mold 60.

Figure 15:
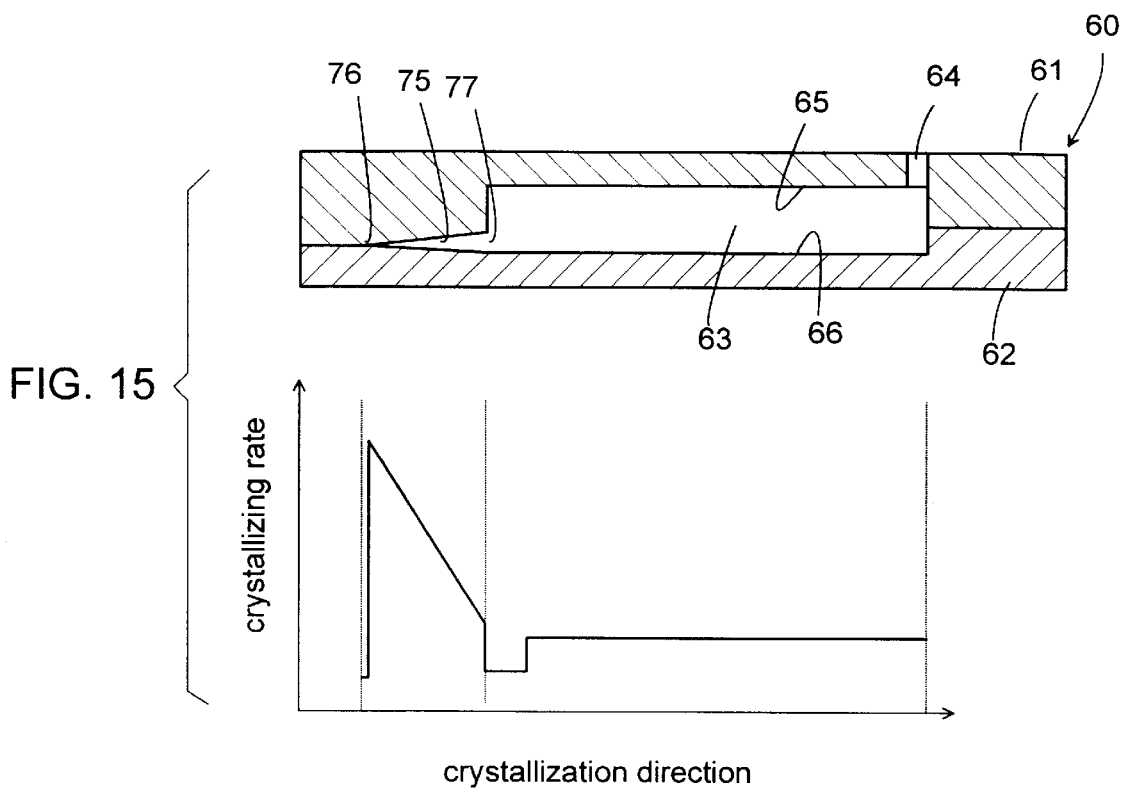
FIG. 15 is a diagram illustrating a crystallizing rate varying along the length of a cavity of the mold.
Figure 16:
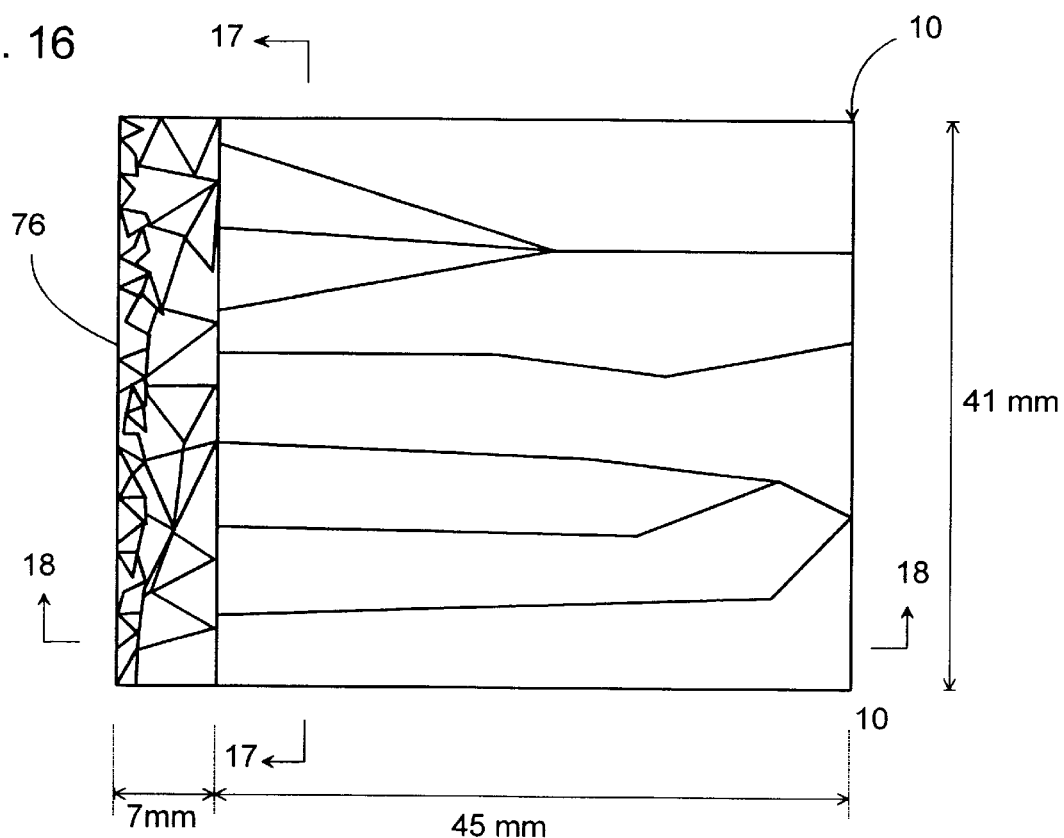
FIG. 16 is a diagram illustrating a grain growth in the mold.
Figure 17:
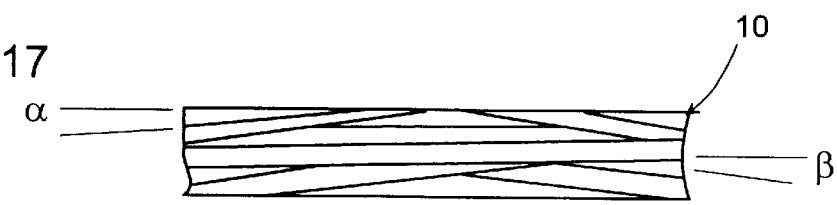
FIG. 17 is a partial section taken along line 17—17 of FIG. 16.
Figure 18:
FIG. 18 is a partial cross-section taken along line 18—18 of FIG. 16.

Thereafter, at least one of the heaters 81 and 82 are controlled to give a temperature gradient which is lower towards the distal end 76 than at the aperture 77 in order to begin crystallization of the material firstly at the distal end 76 and to proceed the crystallization along the length of the slit 75. That is, firstly the material is solidified at the distal end 76 to provide a seed site thereat for subsequent crystallization. Then, the crystallization from this seed site is controlled to proceed firstly at a relatively high rate and then at a low rate in order to obtain a grain size of about 2 to 5 mm adjacent the aperture 77, as shown in FIGS. 15 and 16. The grains of the material being crystallized is schematically shown in FIG. 16. Thereafter, a control is made to give a temperature gradient in the direction of thickness of the mold 60 within a zone adjacent the aperture 77, i.e., the left hand end of the cavity 63, so that the temperature is lower towards the bottom of the zone than at the top of the zone immediately adjacent the aperture 77 for proceeding the crystallization of the material within this zone in the direction of the thickness of the mold, i.e., the resulting ingot plate. The zone has a length of about 3 mm from the aperture 77 and extend along the width of the mold 60 over 41 mm width. The material is crystallized in this 3 mm-long zone along the thickness of the mold over about 2 hours.

During this crystallization along the thickness of the mold, one or more of the heaters are controlled to give substantially unaltered distribution of temperature along the length of the cavity 63, suspending the progress of the crystallization along that direction. With this result, the solidified zone is given a layered origin from which the crystallization of the material proceeds along the length of the cavity 63 to give the layered structure with substantially parallel cleavage planes as intended, in response to a subsequent control of solidifying the material in the lengthwise direction of the cavity. The material is solidified at a slow rate of as low as 28 mm/h in this subsequent crystallization to fully solidify the material in about 16 hours to have a grain size of about 10 to 45 mm. It should be noted in this connection that a control is made for the heaters to give no substantial temperature gradient along a width direction of the cavity, i.e., that of the ingot plate during the above crystallization processes.

Figure 3:
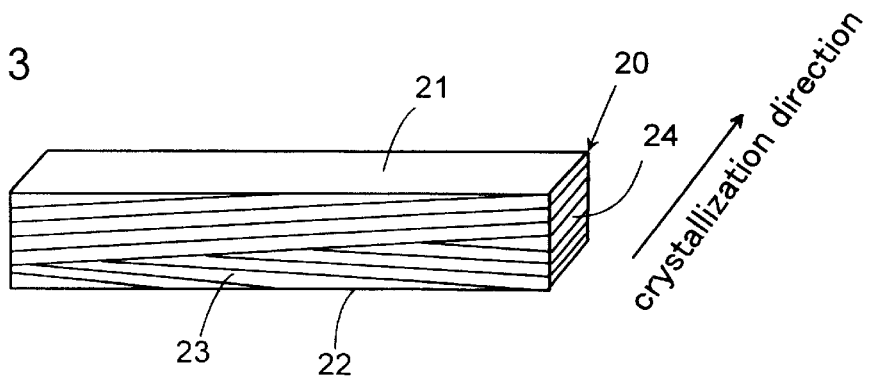
FIG. 3 is a perspective view of a thermoelectric bar cut from the above ingot plate.

Although an exact mechanism can not be sufficiently explained, the resulting ingot plate 10 removed from the mold 60 exhibits the layered structure as mentioned hereinbefore with reference to FIGS. 1 to 3. However, it is assumed important that sufficiently large grain size is necessarily formed in the slit 75 immediately adjacent the aperture 77 and that the crystallization of the material in the zone adjacent the aperture 77 within the cavity 63 should proceed in the direction of thickness of the mold prior to being crystallized in the lengthwise direction of the cavity 63. Anyway, as a result of crystallization from the distal end 76 and through the slit 75, and of controlling to crystallize the material within the zone adjacent the aperture 77 in the direction of the thickness of the mold, the subsequent crystallization propagates in the direction substantially parallel to the top and bottom inner walls 65 and 66 of the cavity 63 to give the resulting cleavage planes substantially parallel to the top and bottom of the ingot plate 10. During the above crystallization process, the heaters 81 to 84 are controlled to give a crystallizing rate which varies as the crystallization proceed in the lengthwise direction of the cavity 63, as shown in FIG. 15.

Figure 19:
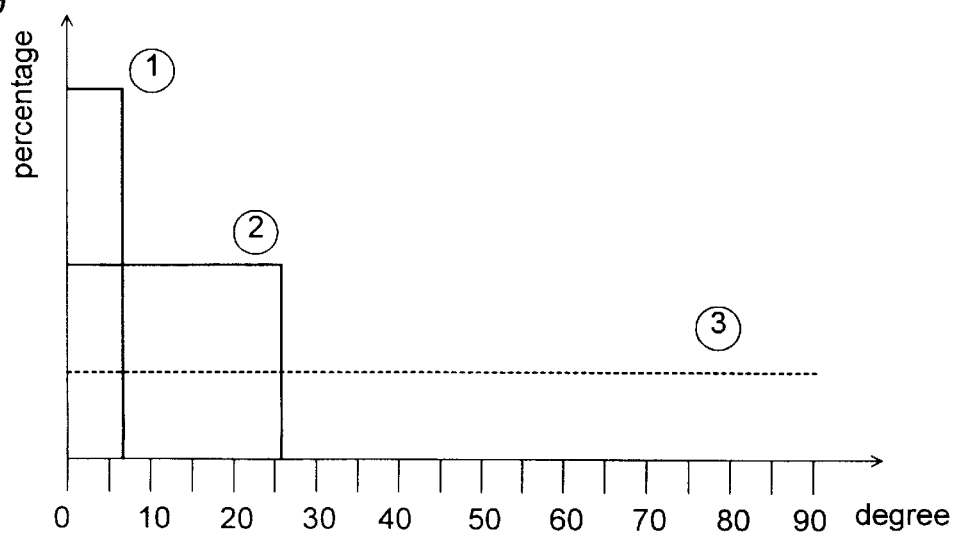
FIG. 19 is a graph illustrating distributions of a first cleavage angle of the cleavage planes for the ingot plate of the present invention and that of the conventional thermoelectric plate.

It is confirmed for the ingot plate thus molded that substantially all the cleavage planes have the first cleavage angle of 7° or less and the second cleavage angle of 5° or less, as indicated by a solid line ① in FIG. 19 (in which only the first cleavage angle is shown), in very contrast to a dotted line ③ shown in FIG. 19 for the conventional thermoelectric plate in which all the cleavage angles of are evenly distributed. In fact, the ingot plate is found to have a strain of as much as 0.6% until it is fractured, as indicated by ① in FIG. 20, in very contrast to that the conventional plate gives a strain of only 0.25% as indicated by ③ in the figure. Also, the ingot plate of the present invention is found to have a reduced Young's modulus of as less as 3700 to 6700 MPa, which demonstrate improved toughness, while the conventional plate has as much as 7700 to 18000 MPa. Further, as shown by rounded dots in FIG. 21, it is found that the ingot plate of the present invention a superior combination of large thermoelectric figure of index Z of as large as $2.7 \times 10^{-3}$ $K^{-1}$ or more and large maximum strain before fracture of at least 0.5%. The thermoelectric FIGURE of index Z is defined as $$Z = \frac{\alpha^2 \sigma}{k}$$

wherein α is a Seebeck coefficient (volt/kelvin), σ is electrical conductivity (S/m), and k is thermal conductivity (W/m-K). In contrast, the conventional thermoelectric plate has a tendency of decreasing the maximum strain before failure with an increasing thermoelectric figure of index Z as shown by triangle dots in FIG. 21, and therefore fail to give the high performances in these two characteristics. This is assumed to result from a structure inherent to the conventional plate in which cleavage planes are randomly arranged at different angles. In contrast, the ingot plate can exhibit a superior maximum strain before fracture even with the increased thermoelectric performance because of the layered structure in which the cleavage planes are uniformly oriented as discussed hereinbefore.

However, the first cleavage angles of 26.4° or less (as indicated by a solid line ② in FIG. 19) and second cleavage angle of 10° or less are found sufficient for the intended use of the ingot plate, and can be obtained by somewhat rough control of the heaters and rough design of the slit. The first cleavage angle of 10° or less and second cleavage angle of 5° or less are preferred in view of combining the process efficiency and the desired characteristics of the ingot plate. As a matter of course, the ingot plate is expected to give superior characteristics of the ingot plate as the first and second cleavage angles are made small.

After removing the ingot plate 10 from the mold 60, it is cut into the bars 20 along the cutting planes CP1 and CP2 of FIG. 1 to dispose the angled end portions. In view of that the chips 30 cut from the bar 20 see an electric current flowing between the electrodes 25 along the crystallization direction, the thermoelectric characteristics of the chips is dependent upon the crystallization direction. Since the crystallization proceed in substantially the same direction along the length of the cavity 63, the bar 20 cut out from the ingot plate 10 can have the uniform thermoelectric characteristics over the length of the bar so that the individual chips 30 cut out from the bar 20 can have uniform thermoelectric characteristics, enabling to realize reliable thermoelectric circuit module.

Figure 22:
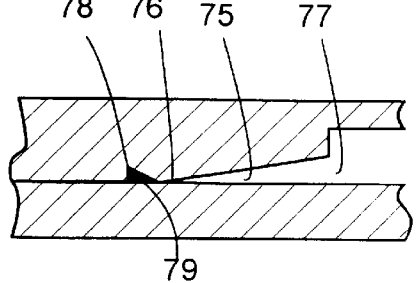
FIG. 22 is a schematic view of a modified mold with a trap for a seed crystal.

Although the above embodiment is shown to use mold with a single slit 75, it is equally possible to give a plurality of slits arrange along the thickness of the mold. Also, one or more of seed crystals may be placed at the distal end of the slit, instead of forming such crystals thereat by firstly solidifying the material. In such case, the mold is formed additionally with a tiny trap 78 which communicates with the distal end 76 of the slit 75 to receive therein the seed crystal 79, as shown in FIG. 22. The seed crystal 79 can be formed by the molten material itself in the previous process of fabricating the ingot plate and be retained in the trap 78 for the subsequent process. When using the seed crystal 79, it is preferred to contact the seed crystal sufficiently with a fresh molten material over a relatively long period without rapidly solidify the material at the distal end 76.

What is claimed is:

1. An ingot plate (10) made of a crystallized cleaveable thermoelectric material, said plate having substantially parallel opposed upper and lower faces (11,12), opposed longitudinal end faces (13), and opposed side faces (14), characterized in that said plate is of a layered structure having substantially parallel cleavage planes (X1 to Xn; Y1 to Yn), that substantially all of said cleavage planes appearing in said opposed end faces are disposed at a first cleavage angle of not more than 26.4° with respect to said upper and lower faces, and that substantially all of said cleavage planes appearing in said side faces are disposed at a second cleavage angle of not more than 10° with respect to said upper and lower faces.

2. An ingot plate (10) as set forth in claim 1, wherein said first cleavage angle is not more than 10° and said second cleavage angle is not more than 5°.

3. An ingot plate (10) as set forth in claim 1, wherein plate has a crystallization direction which is substantially perpendicular to said longitudinal end faces (13) and is substantially in parallel with said opposed upper and lower faces (11, 12).

4. An ingot plate (10) as set forth in claim 1, wherein cleaveable thermoelectric material is collectively defined to have Av-Bvi components, in which Av and Bvi denote material resepectively selected from the groups V and VI of the periodic table.

5. An ingot plate (10) as set forth in claim 1, wherein ingot plate shows at least 0.5% of a maximum strain before fracture and at least $2.7 \times 10^{-3}$ $K^{-1}$ of thermoelectric figure of index Z which is determined by the following equation:

$$Z = \frac{\alpha^2 \sigma}{k}$$

wherein $\alpha$ is a Seebeck coefficient (volt/kelvin), $\sigma$ is electrical conductivity (S/m), and k is thermal conductivity (W/m-K).

6. A rectangular bar (20) cut from said ingot plate as defined in any one of claims 1 to 5, wherein said bar have opposed top and bottom (21, 22), opposed sides (23), and opposed longitudinal ends (24), said opposed sides (23) being defined by cutting planes along which said ingot plate (10) is cut into said bar (20), said bar formed on said opposite sides respectively with at least one electro-conductive layer (25,26,27).

7. A rectangular bar (20) as set forth in claim 6, wherein each said opposed sides (23) is in the form of a rectangular having a length (L) between the opposed longitudinal ends (24) and a width (W) between said top and bottom (11, 12), said electro-conductive layer (25) defining an electrode and being formed centrally on each of said opposed sides (23) to extend over an electrode length (E) in such a manner as to leave blank areas (29) on the longitudinal end portions of each of said opposed sides (23), said electrode length (E) being at least two times said width (W), and said length (L) being at least five times said width (W).

8. The rectangular bar (20) as set forth in claim 6, wherein said one electro-conductive layer (25) is made of a material selected from a first group consisting of Pb—Sn, Bi—Sn, Sb—Sn, Sn, and Au, another electro-conductive layer (26) made of a material elected from a second group consisting of Ni and Al and being formed under said one electro-conductive layer, and a further electro-conductive layer (27) made of a material selected from a third group consisting of Mo and W and being formed under said another electro-conductive layer (26).

9. A process of fabricating the ingot plate (10) as defined in any one of claims 1 to 5, said process being characterized to utilize a molding die (60) with a flat cavity (63), a filling opening (64) at one longitudinal end of said cavity, and at least one elongated slit (75) extending from the other longitudinal end of said cavity in a direction away from said cavity (63) and terminate at a distal end (76) within said molding die, said process comprising the steps of:

introducing a molten semiconductor material into said flat cavity (63) through said filling opening (64) and penetrating said molten material through said slit (75) to said distal end (76);

allowing said molten material to start crystallizing at said distal end (76) and to proceed the crystallization of the material along the length of the slit (75), thereby proceeding the crystallization of the material within said cavity (63) substantially along said longitudinal direction to give said crystallization direction to the crystallized ingot plate formed in said cavity; and removing said crystallized ingot plate (10) from said cavity.

10. A process of fabricating the ingot plate (10) as defined in any one of claims 1 to 5, said process being characterized to utilize a molding die (60) with a flat cavity (63), a filling opening (64) at one longitudinal end of said cavity, and at least one elongated slit (75) extending from the other longitudinal end of said cavity in a direction away from said cavity (63) and terminate at a distal end (76) within said molding die, said process comprising the steps of:

introducing a molten semiconductor material into said flat cavity (63) through said filling opening (64) and penetrating said molten material through said slit (75) to said distal end (76);

allowing said molten material to start crystallizing at said distal end and to proceed the crystallization of the material along the length of the slit (75), thereby proceeding the crystallization of the material within said cavity (63) substantially along said longitudinal direction to give said crystallization direction to the crystallized ingot plate formed in said cavity;

removing said crystallized ingot plate (10) from said cavity; and cutting said plate (10) along planes perpendicular to said crystallization direction into a plurality of elongated rectangular bars (20) having opposed top and bottom faces (21,22), opposed sides (23), and opposed longitudinal ends (24), said opposite sides being defined by said planes along which said plate is cut into said bar.

11. A process of fabricating the ingot plate (10) as defined in any one of claims 1 to 5, said process being characterized to utilize a molding die (60) with a flat cavity (63), a filling opening (64) at one longitudinal end of said cavity, and at least one elongated slit (75) extending from the other longitudinal end of said cavity in a direction away from said cavity (63) and terminate at a distal end (76) within said molding die, said process comprising the steps of:

introducing a molten semiconductor material into said flat cavity (63) through said filling opening (64) and penetrating said molten material through said slit (75) to said distal end (76);

allowing said molten material to start crystallizing at said distal end (76) and to proceed the crystallization of the material along the length of the slit (75), thereby proceeding the crystallization of the material within said cavity (63) substantially along said longitudinal direction to give said crystallization direction to the crystallized ingot plate formed in said cavity;

removing said crystallized ingot plate (10) from said cavity;

cutting said plate (10) along planes perpendicular to said crystallization direction into a plurality of elongated rectangular bars (20) having opposed top and bottom faces (21,22), opposed sides (23), and opposed longitudinal ends (24), said opposite sides being defined by said planes along which said plate is cut into said bar;

forming electro-conductive layers (25) respectively on said opposite side faces of said bar; and cutting said bar (20) with said electro-conductive layers (25) into a plurality of the chips (30) each having a pair of electrodes (25) formed from said electro-conductive layers on opposite ends of said direction of grain growth.

12. The process as set forth in claim 9, wherein said slit (75) has an aperture (77) which opens to said cavity (63) at one end along a thickness of said cavity (63).

13. The process as set forth in claim 9, wherein said slit (75) has an aperture (77) which opens to said cavity (63) and said slit (75) has a thickness narrower towards said distal end (76) than at said aperture (77).

* * * * *